United States Patent [19]
Heinlen et al.
[11] 3,736,367
[45] May 29, 1973

[54] LEAD FRAMES AND METHOD OF MAKING SAME

[75] Inventors: Frederick Jay Heinlen, Etters; Randy Marshall Manning, Harrisburg, both of Pa.

[73] Assignee: AMP Incorporated, Harrisburg, Pa.

[22] Filed: Apr. 9, 1971

[21] Appl. No.: 132,852

[52] U.S. Cl. .............174/52 S, 113/119, 174/DIG. 3, 29/576 S
[51] Int. Cl. .............H01l 5/00
[58] Field of Search .............113/119; 29/630 A, 29/630 B, 576 S, 193.5; 317/234 N; 174/DIG. 3

[56] References Cited

UNITED STATES PATENTS

| | | | |
|---|---|---|---|
| 3,597,666 | 8/1971 | Taskovich | 317/234 N |
| 2,476,429 | 7/1949 | Paules | 113/119 |
| 3,569,797 | 3/1971 | Simmons | 317/234 N |
| 3,628,483 | 12/1971 | Pauza | 174/DIG. 3 |

*Primary Examiner*—Richard J. Herbst
*Attorney*—William J. Keating, Ronald D. Grefe, Gerald K. Kita, Frederick W. Raring and Jay L. Seitchik

[57] ABSTRACT

The disclosure relates to a lead frame having a plate-like heat sink portion and three leads, one of which is integral with the heat sink, are manufactured by blanking heat sink and leads, bending the integral lead relative to the heat sink, forming ends of the remaining leads, and again bending integral leads so that leads are in a plane which is parallel to, and spaced from the heat sink.

3 Claims, 12 Drawing Figures

LEAD FRAMES AND METHOD OF MAKING SAME

This invention relates to transistor lead frames and, more particularly to one piece lead frames formed on a continuous strip.

A common type of transistor lead frame comprises a relatively massive heat sink, on which the transistor or chip is mounted, and three leads which are disposed in a plane extending parallel to, and spaced from, the heat sink. The center lead is connected to the heat sink and the end leads have their end portions extending over the surface of the heat sink and are reversely bent towards each other so that their tips lie between the two planes. The transistor is disposed beneath the tip portions of the outside leads and these tips are bonded to the contact portions of the chip, the center lead serving as a collector for the transistor.

Lead frames of the type described above require leads of relatively thin stock metal. They also require a relatively thick heat sink to provide the required heat dissipation ability. Because of this fact, and because of the relative complexity of this type of lead frame, it has been customary in the past to manufacture such lead frames from two separate strips which are subsequently assembled to each other. The heat sinks are manufactured by stamping a relatively thick metal strip and the leads are manufactured by stamping and forming a relatively thin strip. The collector lead, in accordance with prior art practice, may then be assembled to the heat sink by a clinching or other mechanical fastening operation.

The prior art was improved as described in the application of Frederick J. Heinlen, Ser. No. 70,034 filed Sept. 8, 1970, now U.S. Pat. No. 3,650,232, granted Mar. 21, 1972, wherein there is disclosed a one piece transistor lead frame having a relatively thick plate-like heat sink section and three leads which are intricately formed in spaced relationship to the heat sink.

However, the lead frame of this application required extremely difficult bends in the formation thereof, thereby requiring complex production steps. The lead frame of said copending application also was more subject to breakage in the region of complex handling.

In accordance with the present invention, a one piece lead frame is provided wherein the bending steps are less severe than those of the prior art, thereby permitting the use of less costly production techniques and providing a more reliable lead frame.

It is accordingly an object of the invention to provide an improved method for manufacturing transistor lead frames.

It is a further object of this invention to provide a method for manufacturing lead frames having a heat sink and having intricately formed leads in the form of a continuous strip.

It is a yet further object of this invention to provide a lead frame requiring minimal and simple bends.

These and other objects of the invention are achieved in a preferred embodiment thereof which is briefly described in the foregoing abstract, which is described in detail below, and which is illustrated in the accompanying drawings in which.

Figures 4, 5:
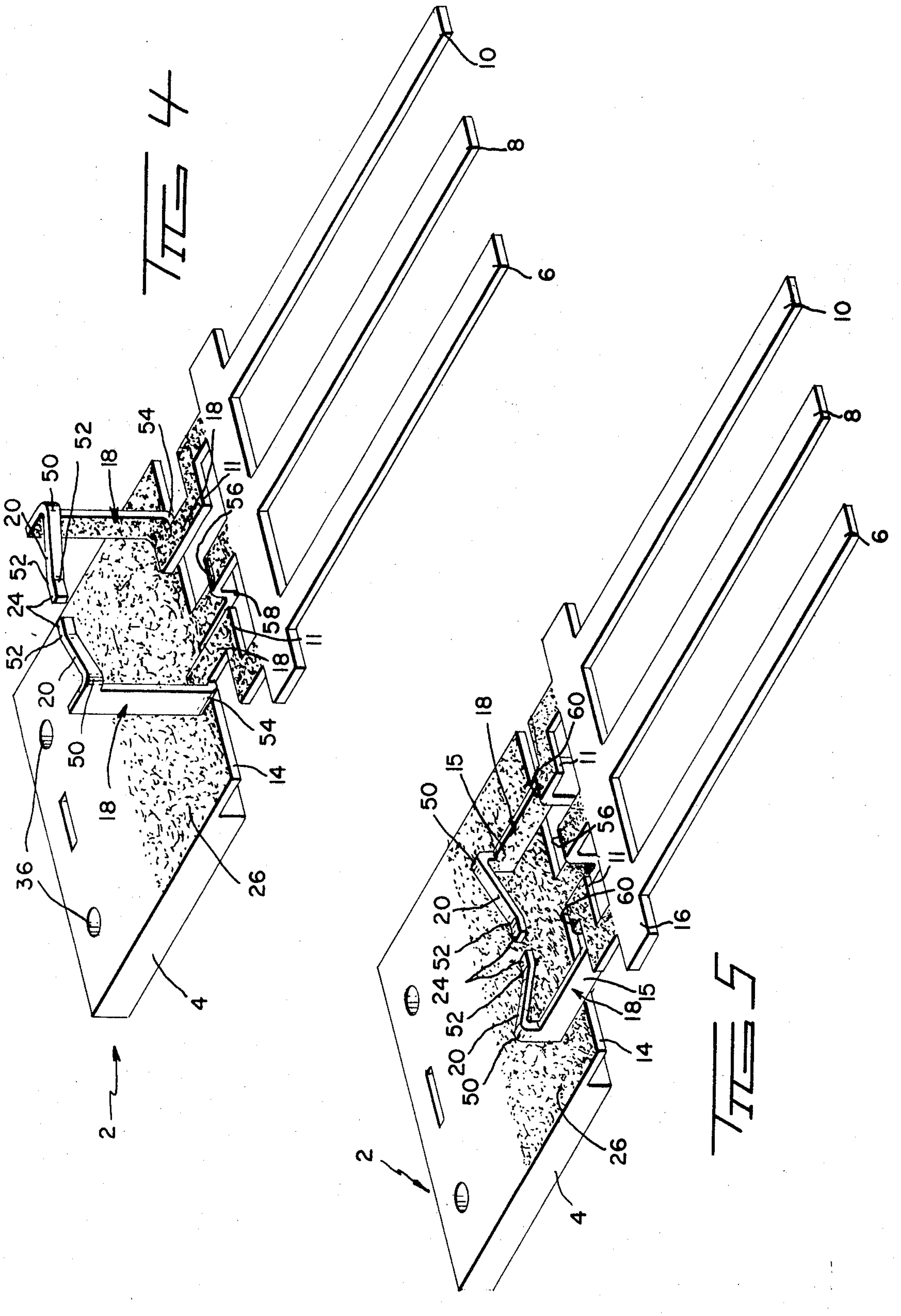
FIG. 4 is a perspective view of the portion of the strip of FIG. 1 after the third, fourth and fifth bending operation thereon.
FIG. 5 is a perspective view of the portion of the strip of FIG. 1 after the sixth bending operation thereon.

Referring first to FIG. 5, there is shown a typical transistor lead frame 2 of the type adapted to be produced in accordance with the method of the present invention which comprises a relatively thick and massive metallic heat sink 4 having three leads 6, 8 and 10 associated therewith. These leads are disposed in a plane which extends parallel to, and is spaced from, the plane of the heat sink 4, the center lead 8 being bent downwardly at its inner end 13 and including a connecting strap portion 12 which is integral with one edge 14 of heat sink 4. The outside leads 6, 10 are bent downwardly and have end portions 18 which extend over the upper surface of the heat sink 4 and past the edge 14. These outside leads have contact arms 20 on their ends which extend laterally in opposite directions and which are reversely bent downwardly towards the heat sink and inwardly towards each other so that the tips 24 of these arms are disposed in front of the connecting strap 12 and immediately above the surface of the heat sink. It should be noted at this point that these arm tips 24 are spaced apart by a distance which is substantially less than the width of the connecting strip 12 of center lead 8. This spacing is relatively critical for the reason that the tips of these contact arms will be bonded to the contact areas of the chip which is mounted on the heat sink. The outer arms 6, 10 are not directly connected to the heat sink 4 but are integral with the center lead 8 by virtue of the presence of a transversely extending tie bar 16.

When a transistor is assembled to the frame 2, the transistor or chip is placed on the upper surface of heat sink 4 with the tip portions 24 of the contact arms disposed against the contact areas of the chip. The chip has a thickness which is somewhat greater than the spacing between the ends 24 of the arms and the surface of the heat sink so that the chip is resiliently held in position while the frame is passed through a furnace in which solder metal 26 on the surface of the heat sink is reflowed to secure the chip to the frame. Thereafter, the ends of the leads, the chip, and portions of the heat sink are encapsulated by a molding process, the tie bar 16 functioning as a mold closure or dam bar during molding. The portions of the tie bar which extend between the leads are then removed by a stamping operation so that they are electrically separated from each other.

Figure 1:
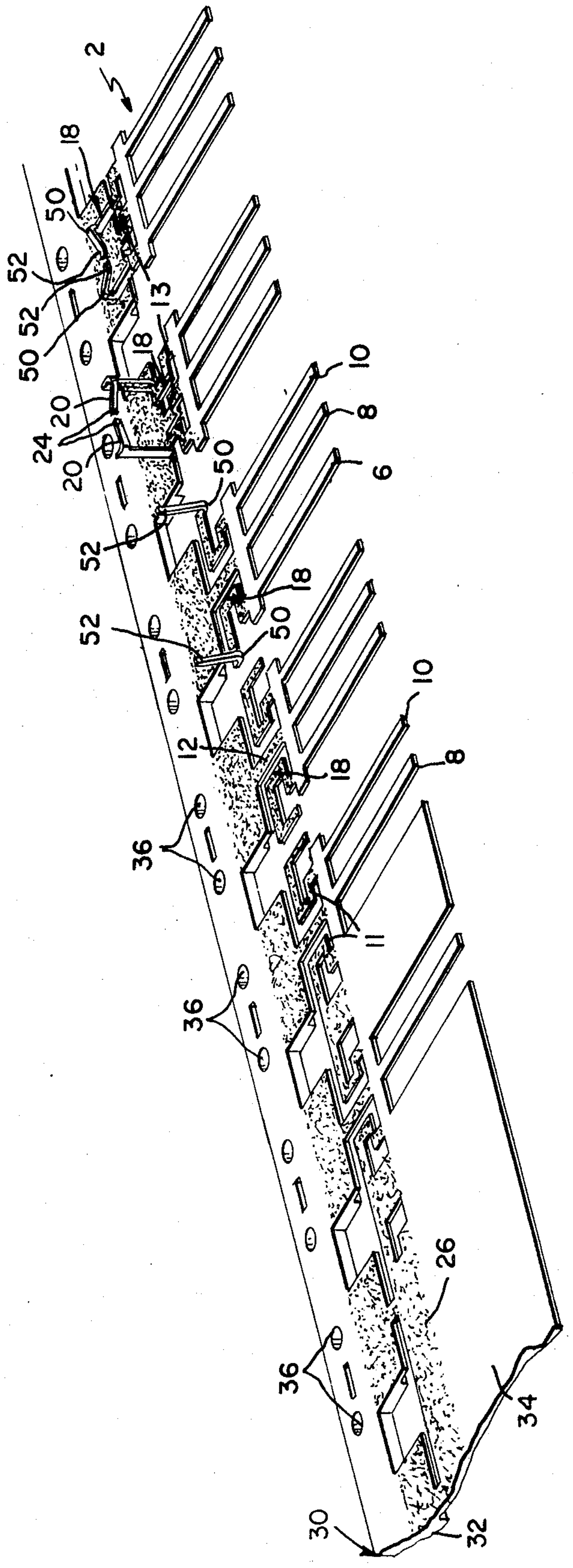
FIG. 1 is a plan view of a strip progression produced by successive bending operations in the formation of lead frames in accordance with the present invention.

Turning now to FIG. 1 the method aspect of the invention is illustrated by the progression which shows the successive stamping and forming steps performed on strip metal to produce the finished lead frame. The strip metal stock 30, has a relatively thick section 32 and a relatively thin section 34 with a pre-applied solder stripe 26 on the surface of the thick section and adjacent portions of the thin section. Stock metal of this type may be produced by rolling or by milling metal strip having a uniform thickness. Frames in accordance with the invention are conventionally produced from copper alloy stock which has been plated with nickel although other metals may be used.

Figures 2, 3:
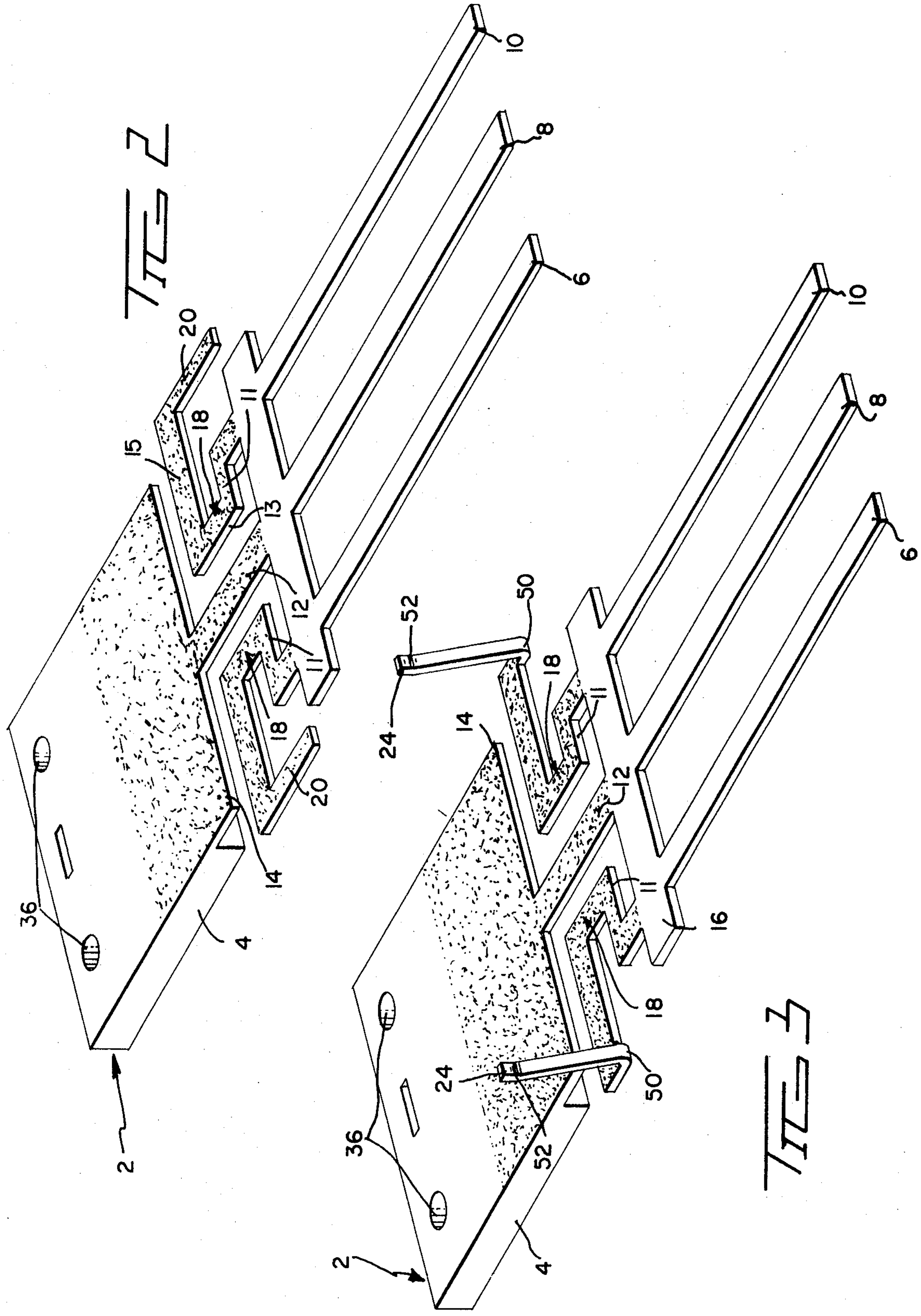
FIG. 2 is a perspective view of the portion of the strip of FIG. 1 after stamping and prior to bending.
FIG. 3 is a perspective view of the portion of the strip of FIG. 1 after the first two bending operations thereon.

Lead frames in accordance with the invention are advantageously produced by blanking the metal stock 30 as shown in FIG. 1 to define for each lead frame a mounting plate or heat sink portion 4 having a first lead 8 integral with and extending therefrom. Second and third leads 10, 6 respectively are formed on each side of the first lead and are jointed thereto by an integral tie bar 16. The end portions of the second and third leads extend beyond the tie bar and towards the mounting plate portion 4 and have transition blank sections integral therewith. These transition blank sections each have a first arm which extends inwardly towards the first lead, a second arm 13 which extends parallel to the first lead and towards the mounting plate section 4, and a third arm which 15 extends laterally away from the center or first lead. A contact arm 20 extends from the third arm parallel to the leads and away from the mounting plate portion. This blank as shown in FIG. 2 can be formed by either of two methods to produce a lead frame of the type shown in FIG. 5 or the type shown in FIG. 12. To produce the lead frame shown in FIG. 5 (FIG. 3), the contact arms 20 are bent upwardly at bends 50 slightly in excess of ninety degrees and the tip portions 24 are formed by providing downward bends at 52 of less than 90° the angle of bend at 52 is substantially the same as the bend at 50 in excess of 90°. The contact arms 15 are then bent upwardly about 90° at bends 54 and strap portion 12 has a pair of right angle bends formed therein at 56 and 58 to drop the heat sink 4 below the contact arms 18 as best shown in FIG. 4. The contact arms 15 are then bent at bend 60 about 90° to provide the final lead frame as best shown in FIG. 5. The spacing between the tips 24 of the arms 18 at this stage is less than the width of the connecting strap 12. Also, the contact arms 18 are spaced from the heat sink 4.

The order of the bends as described above is critical to the extent that subsequent bends must be able to be performed due to changes in shape of the form.

Subsequently, some conventional punching and coining operations are carried out to remove stock metal between adjacent lead frames and to coin and finally form the sides of the heat sinks.

A lead frame in accordance with the embodiment of FIG. 5 thus has a mounting plate portion 4, the upper surface of which defines a first plane, first, second and third leads 8, 10, 6 disposed in a second plane which is parallel, and spaced from, the first plane. These leads have outer free ends which are remote from the mounting plate portion and have intermediate portions which extend parallel to each other towards the mounting plate portion. The inner ends of the leads which are adjacent to the mounting plate portion have transition sections, the transition section 12 of the first lead 8 extending downwardly towards the first plane and towards the mounting plate portion with which it is integral. The second lead transition section has a first arm 11 which extends from the inner end of the second laterally towards the first lead, a third arm 15 which extends generally parallel to the leads and towards the mounting section, and a second arm 13 which connects the first and third arms, this second arm extending laterally away from the first lead. The second and third arms of the embodiment of FIG. 5 define planes which extend substantially normally of the previously identified first and second plane and the contact arm 20 extends from the end of the third arm downwardly towards the surface of the mounting plane portion. The transition section of the third lead 6 is substantially a mirror-image of the transition section of the second lead 10 although it may differ therefrom in minor respects.

Figures 11, 12:
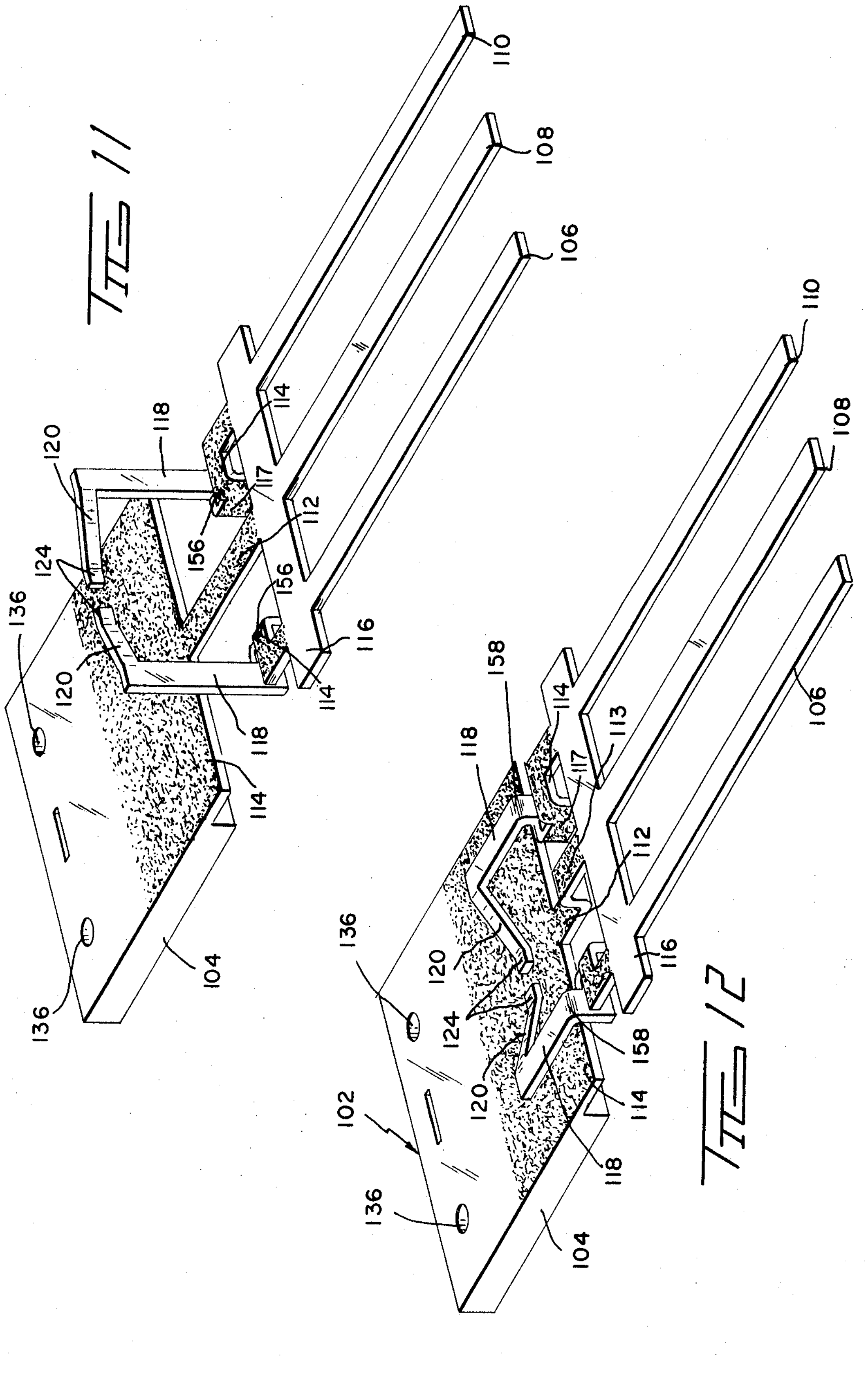
FIG. 11 is a perspective view of the portion of the strip after the fourth bending operation thereon.
FIG. 12 is a perspective view of the portion of the strip of FIG. 7 after the fifth bending operation thereon.

The embodiment of FIG. 12 has a mounting plate portion 104 and first, second and third leads 108, 110, 106 respectively defining first and second planes as previously described. The first arms 114 of the second and third lead transition sections extend inwardly towards the first lead 108 as in the embodiment of FIG. 5. The third arms 118 of this embodiment lie in the second plane and the second arms 117 are generally L-shaped after bending and lie in planes which extend normally of the first and second planes. It will be noted that in both embodiments, the surfaces or undersides of the contact arms which are opposed to the upper surface of the mounting plate or heat sink portion are formed from stock which was coated with solder.

When a transistor is assembled to the frame 102, the transistor or chip is placed on the upper surface of heat sink 104 with the tip portions 124 of the contact arms disposed against the contact areas of the chip. The chip has a thickness which is somewhat greater than the spacing between the ends 124 of the arms and the surface of the heat sink so that the chip is resiliently held in position while the frame is passed through a furnace in which solder metal 126 on the surface of the heat sink is reflowed to secure the chip to the frame. Thereafter, the ends of the leads, the chip, and portions of the heat sink are encapsulated by a molding process, the tie bar 116 functioning as a mold closure or dam bar during molding. The portions of the tie bar which extend between the leads are then removed by a stamping operation so that they are electrically separated from each other.

Figures 6, 8:
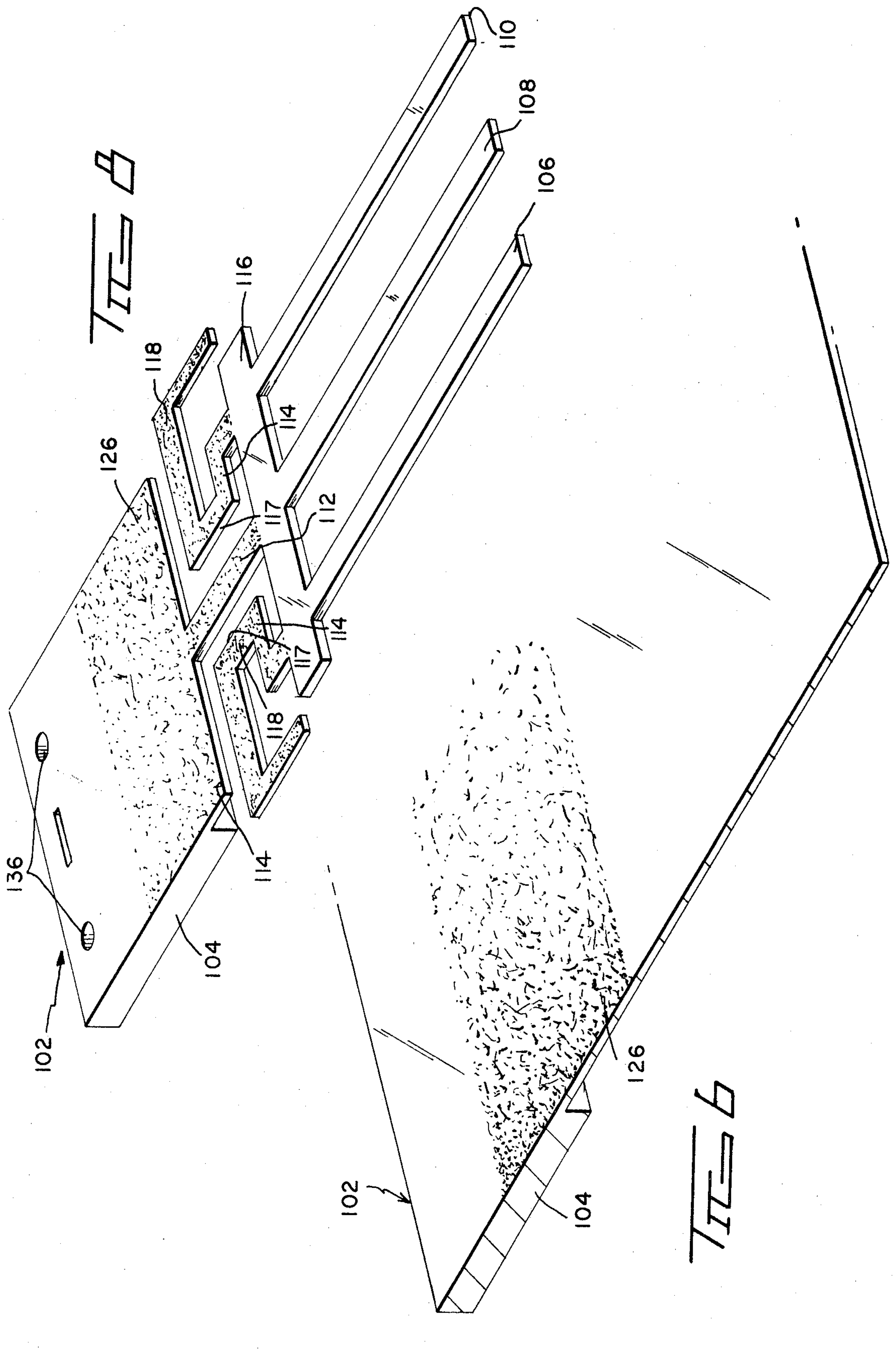
FIG. 6 is a perspective view of a short section of metal stock of the type used to produce lead frames in accordance with the present invention.
FIG. 8 is a perspective view of the portion of the strip of FIG. 1 after stamping and prior to bending.
Figure 7:
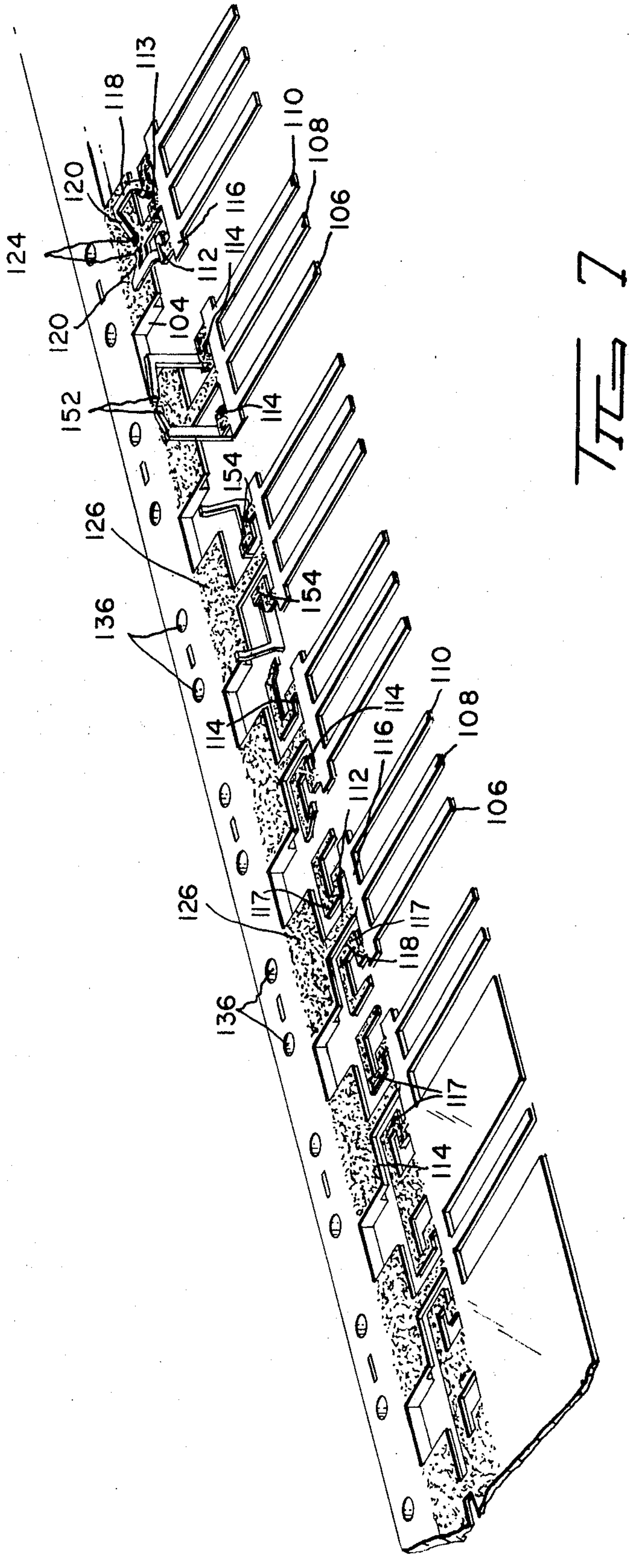
FIG. 7 is a plan view of a strip progression produced by successive bending operations in the formation of lead frames in accordance with a second embodiment of the present invention.

Turning now to FIG. 7 the method aspect of the invention is illustrated by the progression which shows the successive stamping and forming steps performed on strip metal as shown in FIG. 6 to produce the finished lead frame.

Figures 9, 10:
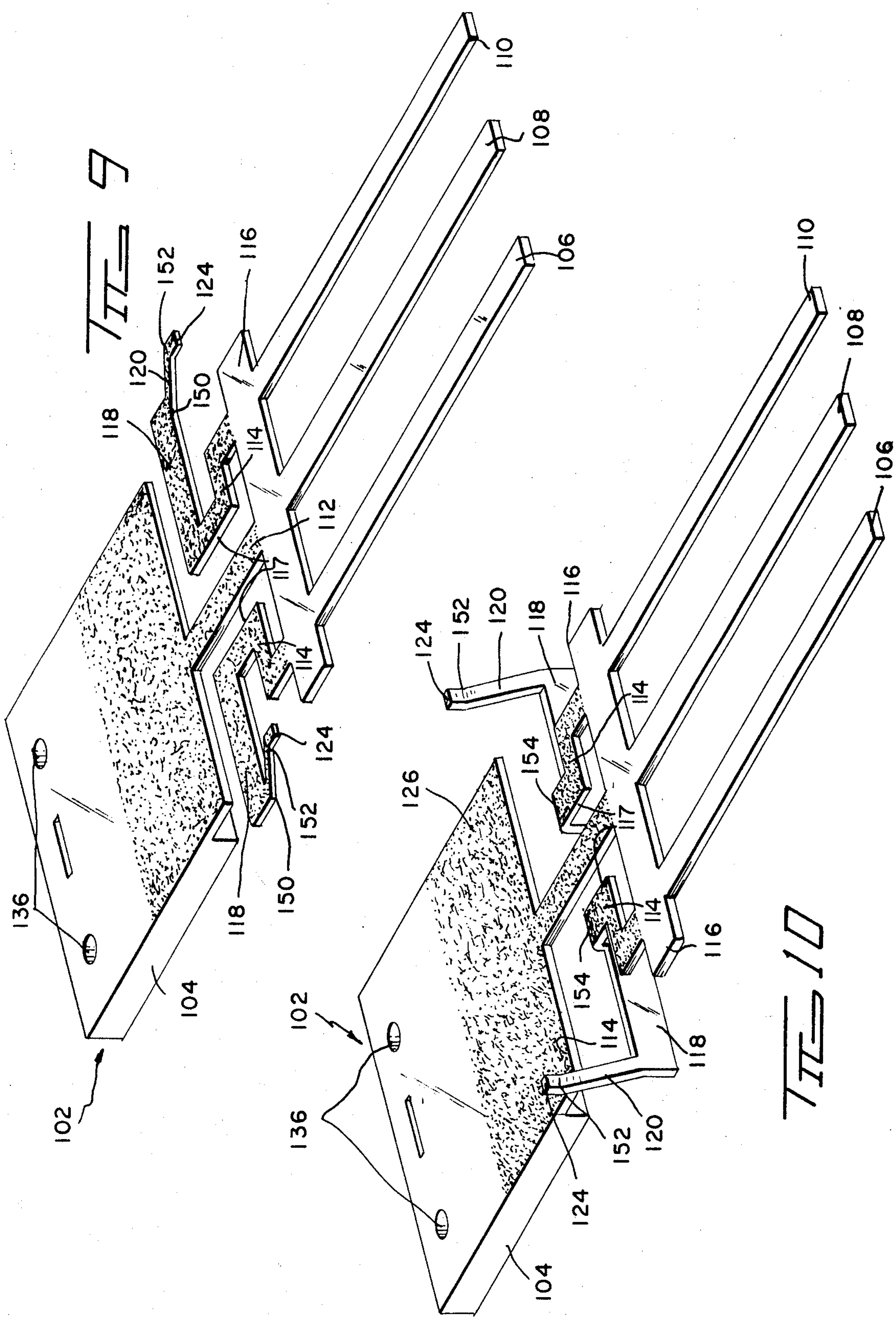
FIG. 9 is a perspective view of the portion of the strip of FIG. 7 after the first two bending operations thereon.
FIG. 10 is a perspective view of the portion of the strip of FIG. 7 after the third bending operation thereon.

After blanking the strip and as best shown in FIG. 9, the contact arms 120 are bent upwardly at bends 150 and downwardly at bends 152, the upward angle at bend 150 being equal to the downward angle at bend 152 whereby the tip portions 124 are parallel to the plane of the member 104. The third arms 118 are then bent ninety degrees in a downward direction at bends 154 as best shown in FIG. 10. The second arms 117 are now bent downwardly at bend 156 by ninety degrees as best shown in FIG. 11. The third arms 118 are now bent by ninety degrees at bends 158 to provide the final lead frame configuration.

A salient feature of both of the embodiments of the invention described above is that in the finished lead frames, the surfaces of the heat sinks and the surfaces of the contact arms which are opposed to the heat sinks are covered with solder. When a chip is mounted on an individual frame and passed through a furnace, the chip is thus soldered to the heat sink and to the undersides of the arms. The solder surfaces on the arms and on the heat sink are achieved from the single stripe of solder which is applied to the original stock metal.

The order of the bends is again critical to the extent that subsequent bends are capable of being performed despite the change in form of the blank.

It can be seen that a strip of lead frames can be provided in accordance with the method above described which requires a minimum number of simple bends after the stamping operation.

Though the invention has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

What is claimed is:

1. A stamped and formed transistor lead frame comprising:

a mounting plate portion having a mounting surface upon which a transistor is adapted to be mounted, said surface defining a first plane, first, second, and third leads, said leads having free ends which are spaced from said mounting plate portions, said leads having intermediate portions which extend parallel to each other and towards said mounting plate portion, said leads being in a second plane which is parallel to, and spaced from, said first plane, said leads having inner ends which are proximate to said mounting plate portion, said first lead being between said second and third leads, a first lead transition section which is integral with said mounting plate portion and said inner end of said first lead, said first lead transition section extending between said first and second planes, a second lead transition section integral with said inner end of said second lead, said second lead transition section comprising a first arm extending from said inner end of said second lead laterally towards said first lead, a third arm extending generally parallel to said leads and over said mounting plate section, and second arm means extending between said first and third arms, said second arm defining planes which extend normally of said first and second planes, a third lead transition section extending from said inner end of said third lead, said third lead transition section being a substantial mirror image of said second lead transition section, and second and third lead contact arms extending from said third arms of said second and third lead transition sections, said contact arms being adapted to be bonded to a transistor supported as said mounting plate section.

2. A lead frame as set forth in claim 1 wherein said third arm means of said second and third lead transition sections lie in planes which extend substantially normally of said first and second planes.

3. A lead frame as set forth in claim 1, said third arms of said second and third lead transition sections lying substantially in said second plane.

* * * * *